United States Patent
Perry et al.

(10) Patent No.: US 7,411,469 B2
(45) Date of Patent: *Aug. 12, 2008

(54) CIRCUIT ARRANGEMENT

(75) Inventors: Colin Leslie Perry, Swindon (GB);
Stephen John Parry, Swindon (GB);
Alessandro F. Deidda, Midglamorgan
(GB); Christopher R. Shepherd,
Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/545,987

(22) Filed: Oct. 10, 2006

(65) Prior Publication Data

US 2007/0057744 A1 Mar. 15, 2007

Related U.S. Application Data

(62) Division of application No. 10/989,897, filed on Nov. 16, 2004, now Pat. No. 7,209,016.

(30) Foreign Application Priority Data

Nov. 24, 2003 (GB) ................................. 0327284.6

(51) Int. Cl.
*H03B 5/18* (2006.01)
(52) U.S. Cl. ..................................... 331/177 V; 331/23
(58) Field of Classification Search ............. 331/177 V, 331/36 C, 179, 23
See application file for complete search history.

(56) References Cited

U.S. PATENT DOCUMENTS

| 5,670,912 | A | 9/1997 | Zocher |
| 5,859,558 | A | 1/1999 | Chen et al. |
| 5,892,400 | A | 4/1999 | Van Saders et al. |
| 6,111,464 | A | 8/2000 | Laureanti |
| 6,255,910 | B1 | 7/2001 | Forstner |
| 6,396,356 | B1 | 5/2002 | Mehta et al. |
| 6,833,769 | B2 | 12/2004 | Seppinen et al. |
| 2002/0008585 | A1 | 1/2002 | Welland |
| 2002/0089387 | A1 | 7/2002 | Grewing et al. |
| 2005/0030116 | A1 | 2/2005 | Takagi |

FOREIGN PATENT DOCUMENTS

| GB | 1095605 | | 12/1967 |
| GB | 2338128 | | 12/1999 |
| GB | 2384125 | A | 7/2003 |
| GB | 2386775 | A | 9/2003 |
| JP | 57210715 | | 6/1981 |
| JP | 61258508 | | 5/1985 |
| JP | 08340214 | | 6/1995 |
| JP | 2001352218 | | 6/2000 |

*Primary Examiner*—Joseph Chang
(74) *Attorney, Agent, or Firm*—Blakely, Sokoloff, Taylor & Zafman LLP

(57) ABSTRACT

A circuit arrangement having a plurality of variable capacitance elements such as varactors is described, the varactors having associated electronic control means which controls the capacitance of the variable capacitance elements over a control range. The control range is such that for any particular variable capacitance element a complete variation from a lowest to a highest capacitance is obtained from only a portion of the control range.

7 Claims, 3 Drawing Sheets

CIRCUIT ARRANGEMENT

CROSS-REFERENCE TO RELATED APPLICATIONS

This application is a divisional application of Ser. No. 10/989,897, filed on Nov. 16, 2004 now U.S. Pat. No. 7,209,016, entitled "Variable Capacitance Circuit Arrangement", and claims priority therefrom.

The present application claims priority to currently pending United Kingdom Patent Application number 0327284.6, filed Nov. 24, 2003.

STATEMENT REGARDING FEDERALLY SPONSORED RESEARCH OR DEVELOPMENT

N/A

BACKGROUND OF THE INVENTION

Varactors are commonly used in RF circuits for tuning oscillators, filters and amplifiers.

One problem with varactors is that their capacitance/voltage characteristics are typically very non-linear as shown in FIG. 1a, which illustrates a typical metal oxide semiconductor varactor (MOSvar) capacitance/voltage characteristic. The non-linear feature of the MOSvar is emphasized by FIG. 1b which shows the first derivative dC/dV of the curve of FIG. 1a.

One device allowing a capacitance/voltage characteristic having an acceptable tuning range and a more linear range to be obtained is a hyper-abrupt varactor. However, the implementation of a hyper-abrupt varactor requires extra processing during manufacture, which is expensive.

An alternative method of overcoming the non-linearity of a varactor is to use digital techniques to switch in capacitors so as to tune over the required range. However, this solution is complex, can be physically large, and may be too slow.

It is an object of the present invention to provide a variable capacitance circuit arrangement having a relatively linear characteristic.

OBJECTS AND SUMMARY OF THE INVENTION

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

According to a first aspect of the present invention, there is provided a circuit arrangement having a variable capacitance for a tuning circuit, wherein the circuit arrangement comprises a plurality of variable capacitance elements connected in parallel and, coupled to the capacitance elements, control means for electronically controlling the capacitances of the variable capacitance elements, the control means having a control range over which they cause the capacitance of the circuit arrangement to vary, the control means and the variable capacitance elements being configured such that at least one of the said elements exhibits complete variation of its capacitance in response to the control means over only a portion of the control range.

The characteristics of the capacitance elements determine the way in which the capacitance of the circuit arrangement varies in response to the control means. For example, the variable capacitance elements may be chosen so as to produce a capacitance versus control voltage response which is more linear over its operating range compared with that of a single varactor. Similarly, the variable capacitance elements may be chosen so as to produce a capacitance response which follows an approximate square law characteristic for a linearized frequency/voltage characteristic when used in conjunction with an inductor to form a resonant network.

The control means may comprise a common control source and a plurality of different respective offset biases applied to the variable capacitive elements.

In a preferred embodiment, the variable capacitive elements are varactor (varactors), which are biased by an offset voltage. In this embodiment, the control means is configured to apply a common control voltage and a plurality of different DC offset voltages to the respective varactors. The voltage applied across each varactor is, therefore, the difference between the common control voltage and the respective offset voltage applied to each varactor, (or the sum of these two voltages, depending on the sign of the offset voltage). When tuning, the varactor only exhibits a change in its capacitance if the difference between the control voltage and the respective offset voltage applied to the particular varactor falls within the range of voltages over which the varactor capacitance varies, in terms of the voltage applied across the varactor itself. Alternatively, the control means may be configured to apply a plurality of different control voltages to the respective varactors. A common bias voltage may be applied.

Each varactor may be arranged to have one of its electrodes coupled to the common control voltage source and its other electrode to a respective DC offset bias voltage source.

The capacitance characteristic of the circuit arrangement is dependent on the number of variable capacitive elements connected in parallel. The more variable capacitive elements used in the circuit, the closer the capacitance characteristic can be to a desired response i.e., linear, square law, etc.

Advantageously, the control means are arranged such that the variable parts of the capacitance response characteristics of the variable capacitive elements overlap. By adjustment of the overlaps, it is possible to alter the overall characteristic of the circuit arrangement to be closer to the desired characteristic.

The variable capacitance elements are preferably selected such that the sum of their individual capacitance values is equal to the required total maximum capacitance of the circuit arrangement. Additionally, the varactors may be selected such that the combination of the ranges over which their individual capacitances vary is substantially equal to the total operational range of the circuit arrangement, In one embodiment, where a generally linear capacitance/voltage characteristic is required, the individual variable capacitance elements may be chosen such that the maximum capacitance of each element is approximately equal to the maximum required capacitance of the circuit arrangement divided by the number of parallel variable capacitive elements. In addition, the individual variable capacitive elements may be chosen such that the range over which each of their individual capacitances vary is equal to the total operating range of the circuit arrangement divided by the number of capacitive elements connected in parallel. For example, if there are three variable capacitive elements in the circuit, the characteristics of the capacitive elements are such that their individual maximum capacitances are each equal to a third of the total capacitance of the circuit arrangement and their effective operating ranges are each approximately a third of the total operating range of the arrangement.

In an alternative embodiment the characteristics of the capacitance elements may be selected such that the resultant capacitance/voltage characteristic has a square law characteristic. In this embodiment the characteristic of each capacitance element may be different from the characteristics of the other capacitance elements, unlike the characteristic of capacitance elements that may be selected if a generally linear CN characteristic is desired.

According to a second aspect of the present invention, there is provided a tunable radio frequency (RF) circuit comprising a circuit arrangement having a variable tuning capacitance, wherein the circuit arrangement comprises a plurality of tuning varactors connected in parallel, and coupled to the tuning varactors, control means for electronically controlling the capacitances of the varactors, and one or more inductors, the control means having a control range over which they cause the capacitance of the circuit arrangement to vary, the control means and the varactors being configured such that at least one of the varactors exhibits complete variation of its capacitance in response to the control means over only a portion of the control range.

In one embodiment, the circuit includes a modulator which comprises a modulation varactor arranged in parallel with the tuning varactors but isolated therefrom by a DC blocking capacitor, the modulation varactor being coupled to a modulation input. The modulation varactor may have an offset voltage applied to one of its electrodes.

According to another aspect of the present invention, there is provided a voltage controllable oscillator comprising a circuit arrangement having a variable capacitance for a tuning circuit, wherein the circuit arrangement comprises a plurality of varactors connected in parallel, and coupled to the varactors, control means for electronically controlling the capacitances of the varactors, the control means having a control range over which they cause the capacitance of the circuit arrangement to vary, the control means and the varactors being configured such that at least one of the varactors exhibits complete variation of its capacitance in response to the control means over only a portion of the control range.

The varactors in the circuit arrangement may be selected such that the capacitance/voltage characteristic of the circuit arrangement has a generally square law characteristic so as to achieve a linearized frequency/voltage response characteristic for the voltage controllable oscillator.

In one embodiment, the voltage controllable oscillator includes a modulator as described hereinabove. This arrangement provides the oscillator with a tuning circuit wherein the frequency of the oscillator can be modulated by a modulation signal independently of the main frequency control signal.

According to yet another aspect of the present invention, there is provided a tunable radio frequency (RE) circuit comprising: the resonant combination of a tuning varactor, a modulation varactor and an associated inductance, the tuning varactor and the modulation varactor being respectively coupled to a tuning control input and modulation input which are DC isolated from each other.

The invention also includes a tunable RF circuit including a plurality of varactors connected in parallel with each other and, coupled to the varactors, capacitance control means operable to apply different variable voltages simultaneously across respective varactors.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

BRIEF DESCRIPTION OF THE DRAWINGS

FIG. 1b is a graph illustrating the first derivative (dC/dV) of the characteristic of FIG. 1a;

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

Figure 2:
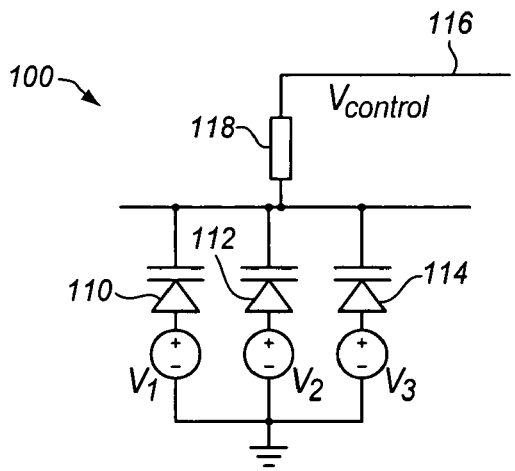
FIG. 2 is a schematic diagram of a circuit arrangement in accordance with the present invention.

Referring to FIG. 2, a variable capacitance circuit arrangement 100 has a variable capacitance formed by three varactors 110, 112, 114 which are connected in parallel. The varactors 110, 112, 114 are each connected at one of their electrodes to a respective DC offset voltage source V1, V2, V3 and, at the other electrode, to a common control input 116 for supplying a control voltage $V_{control}$ via a series impedance 118. In this embodiment each of the offset voltage sources V1, V2, V3 is connected in series between the anode of the respective varactor and one of the supply rails of the arrangement, in this case to ground, the varactors cathodes being coupled to the control input. The DC offset voltage sources V1, V2, V3 each have a different offset voltage level such that each of the varactors 110, 112, 114 contributes to the variation in overall capacitance only when the difference between the control and the respective offset bias falls within the voltage range (in terms of the voltage across the varactor) over which the varactor exhibits a variation in capacitance.

In this embodiment, the different offset voltages V1, V2, and V3 are such that V1 is smaller than V2 which is, in turn, smaller than V3. Therefore, assuming that the individual characteristics of the varactors are similar, if the control voltage is raised progressively from the lower limit of its range to its upper limit, the operation of the circuit 100 will sequentially bring the first varactor 110 into the variable part of its characteristic, followed by the second varactor 112, and finally the third varactor 114.

The different offset voltage levels may be achieved by a number of different arrangements, as would be known by a person of ordinary skill in the art. These arrangements can include the use of a voltage divider circuit, zener diodes, individual DC power sources and the like.

The characteristics of the varactors 110, 112, 114 are selected such that the sum of their maximum respective capacitances is equal to the required total maximum capacitance of the circuit arrangement 100. In addition, the varactor characteristics are selected such that the sum of the maximum ranges of variation in capacitance of the varactors is equal to the required total variation in capacitance of the circuit arrangement 100. If a substantially linear variation of the overall, capacitance with control voltage is required, the varactors are selected so as to have the same or generally similar characteristics, at least insofar as they have at least approximately equal capacitance ranges and capacitance-versus-voltage slopes. If the overall capacitance is to follow an approximate square law characteristic with respect to voltage, as may be required to achieve a linearized tuning frequency-versus-voltage characteristic in a resonant inductance/capacitance circuit such as in an RF voltage-controlled oscillator (VCO), the varactors 110, 112, 114 may be selected to have different capacitance ranges. For instance, the varactor associated with the highest offset voltage may be chosen to have a greater range of variation of capacitance and a steeper capacitance-versus-voltage slope.

Figure 3:
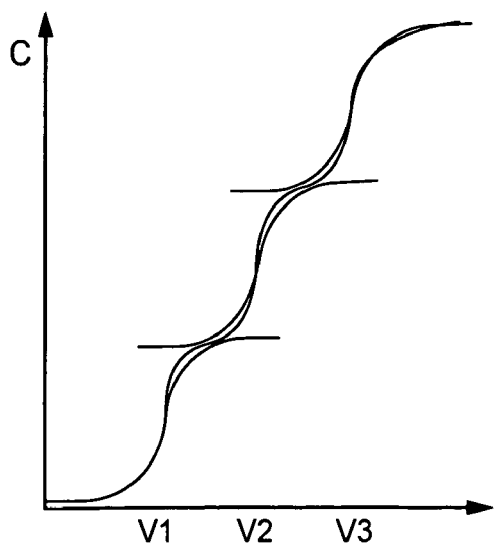
FIG. 3 is a graph illustrating a C/V characteristic of the circuit arrangement shown in FIG. 2.

The offset bias voltages applied to the varactors are preferably set such that there is an overlap, with respect to control voltage, between the high capacitance part of the variable capacitance range of one varactor and the low capacitance part of the range of capacitance of another of the varactors. Overlapping of the variable portions of respective characteristics in this way, as depicted in FIG. 3, contributes to the linearity of the capacitance/voltage characteristics of the composite arrangement 100.

The circuit arrangement 100 is operable such that as the control voltage is increased from a minimum to a maximum voltage, each of the varactors is sequentially operated. That is to say, as the control voltage is increased the varactors are activated such that there is an overlap between the high capacitance range of one varactor and the low capacitance part of the range of capacitance variation of another of the varactors. The total capacitance of the circuit arrangement 100 is equivalent to the sum of the capacitance of each of the varactors.

Figure 1A:
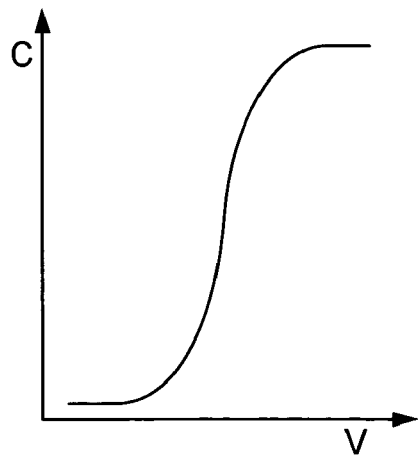
FIG. 1a is a graph illustrating a typical capacitance/voltage (C/V) characteristic of a varactor.
Figure 1B:
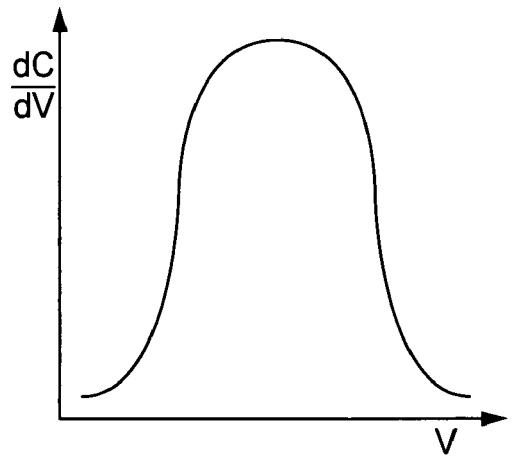
Figure 4:
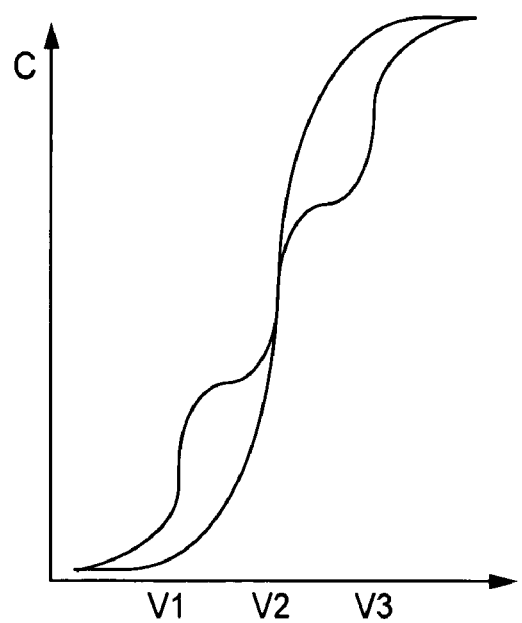
FIG. 4 is a graph illustrating the C/V characteristics shown in FIGS. 1a and 3 in a single representation.
Figure 5:
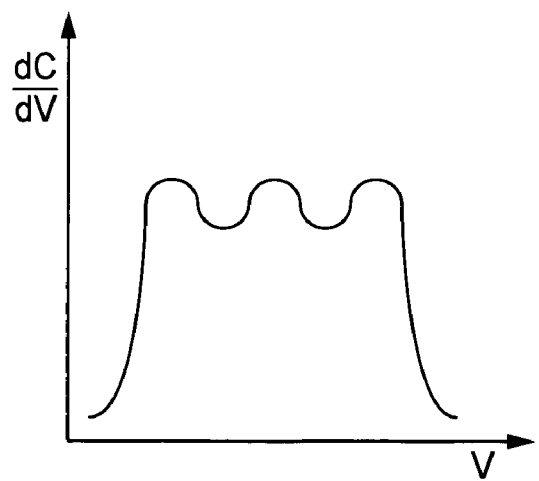
FIG. 5 is a graph illustrating the first derivative (dC/dV) of the capacitance response of the circuit arrangement of FIG. 2.

FIG. 4 shows the capacitance versus voltage characteristic of the circuit arrangement 100 of FIG. 2 superimposed on the equivalent curve of a circuit having a typical single MOSvar, as shown in FIG. 1a. It can be seen that the curve of the circuit arrangement 100 is more linear than that of the MOSvar. This fact is more clearly seen in FIG. 5 which illustrates the first derivative dC/dV of the characteristic of FIG. 3. It can be see that the circuit arrangement 100 produces less variation in the dC/dV characteristic over the operational control voltage range compared with that of the dC/dV characteristic of the typical MOSvar, as evidenced by the approximately flat character of the relevant part of the curve.

To summarize, the circuit arrangement 100 has a capacitive network made up of a number of varactors connected in parallel, each varactor being inherently non-linear over its operating range, and yet the network as a whole having the advantage of a more linear capacitance versus control input response compared to that of the typical varactor implementation capable of capacitance variation over the same range.

The circuit arrangement 100 has many different applications. However, it is of particular benefit in RF tuning circuits such as voltage controlled oscillators, filters and tuned amplifiers.

Figure 6:
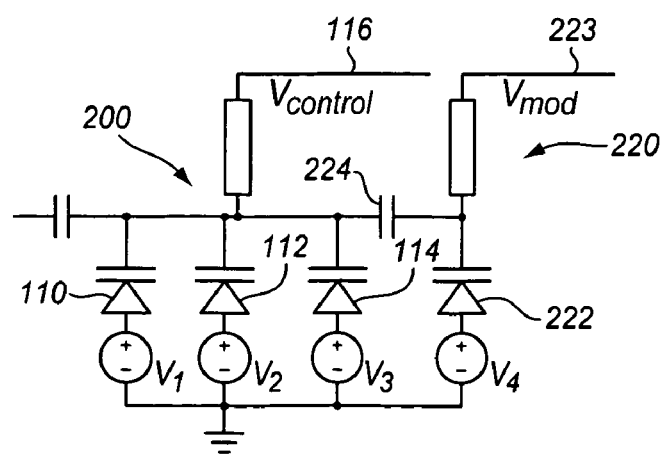
FIG. 6 is a schematic diagram of a circuit arrangement in accordance with the invention, including a modulator.

Referring now to FIG. 6 of the drawings, the capacitance part of a voltage controlled oscillator 200 in accordance with the invention includes a modulator 220. Tuning of the oscillator is accomplished by a network of parallel varactors coupled to a control input and respective offset sources as described above with reference to FIG. 2. The modulator 220 comprises a varactor 222 connected effectively in parallel with the varactors 110, 112, 114 of the tuning network. The modulator varactor is connected at one of its electrodes to a DC offset bias voltage source V4 and at its other electrode to a modulation input 223 for receiving a modulation signal $V_{mod}$. The varactor 222 is coupled to the circuit arrangement 100 via a DC blocking capacitor 224, thereby isolating the modulation input 223 from the control input 116.

Use of an additional varactor 222 specifically for frequency modulation of the VCO output signal, the modulation being applied to this varactor directly from a modulation input which is isolated from the control input 116, has the advantage that the sensitivity of the modulation process can be set substantially independently of the VCO tuning frequency. That is to say, the variations in capacitance produced by the modulation signal applied to the modulation input 226 do not vary significantly in magnitude for a given modulation voltage amplitude as the VCO operating frequency alters. Accordingly, the depth of modulation remains substantially constant.

Figure 7:
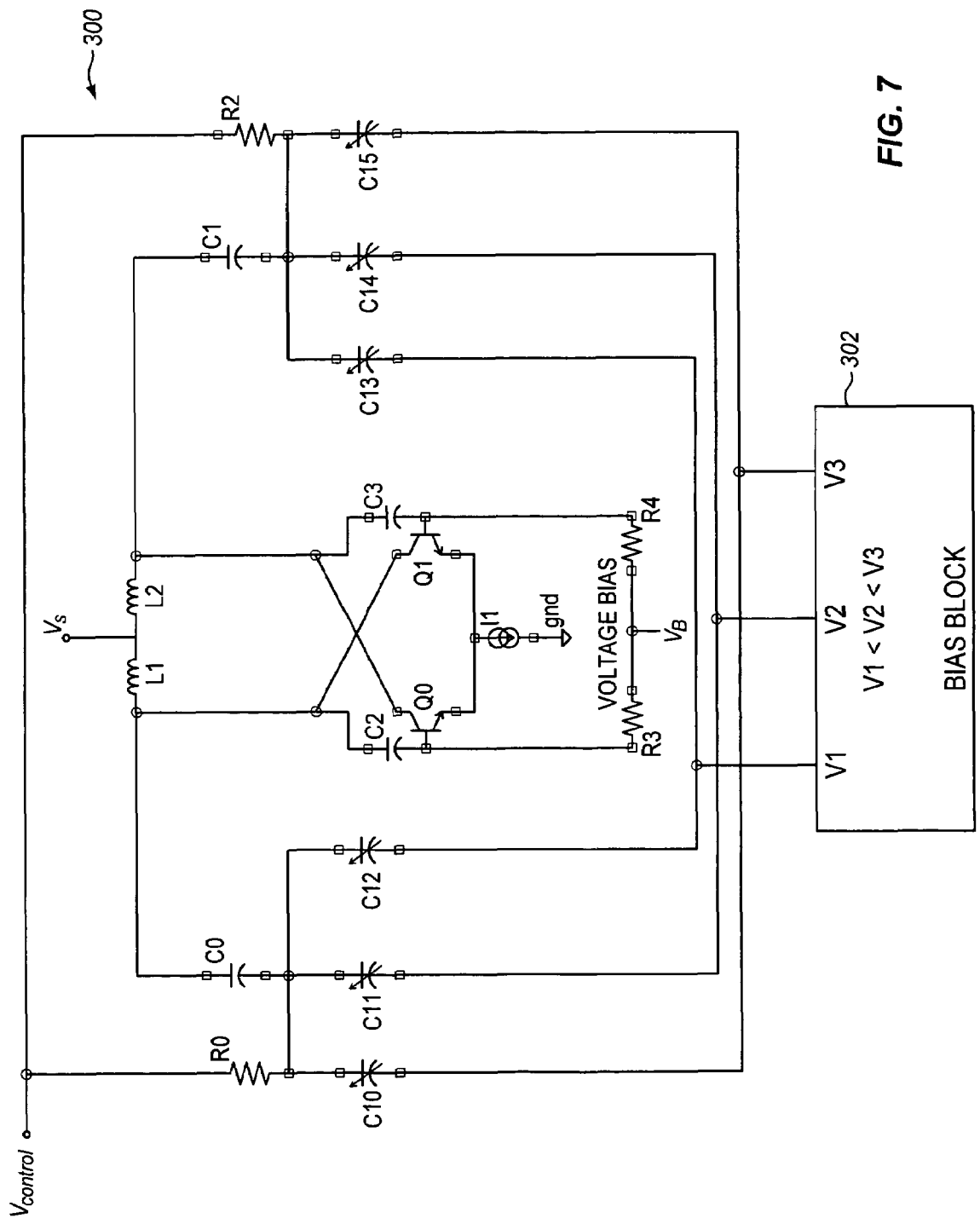
FIG. 7 is a schematic diagram of a voltage controlled oscillator including a circuit arrangement in accordance with the present invention.

Referring to FIG. 7, an emitter coupled LC oscillator 300 in accordance with the invention has a cross-coupled transistor pair Q0, Q1 arranged as a voltage controllable oscillator with a differential output across the collectors of the transistors Q0, Q1.

The frequency of the oscillator 300 is determined by the inductive and capacitive components connected to the collectors of the cross-coupled transistor pair Q0, Q1 and the virtual ground formed by a bias block 302 which incorporates a plurality of offset voltage sources producing varactor bias voltages V1, V2 and V3. In this circuit, the frequency-determining components are inductors L1 and L2, capacitors C0 and C1 and varactors C10, C11, C12, C13, C14 and C15.

Each varactor is connected to a respective DC offset voltage source V1, V2 or V3 in the bias block 302 and the total capacitance of the varactors is adjusted by varying the value of the control voltage, $V_{control}$.

Accordingly, the connections between the voltage bias block 302 and the varactors connected to bias voltages sources V1, V2 and V3 can be considered to be an RF ground. Therefore, the varactors C10, C1 and C13, located on the left hand side (LHS) of the circuit, are effectively connected in parallel at radio frequencies. The total capacitance of the frequency-determining components on the LHS of the circuit is the capacitance resulting from the connection of capacitor C0 in series with the total capacitance of the parallel-connected varactors C10, C1 and C13. Similarly, the capacitance of the frequency-determining components on the right-hand side of the circuit comprises capacitor C0 in series with the parallel combination of the varactors C13, C14 and C15. The total capacitance of the frequency-determining components in the oscillator 300 is equal to the overall capacitance of the frequency determining capacitances (C1, C13, C14, C15) on the RHS in series with the overall capacitance of the frequency determining capacitances (C0, C10, C11, C12) on the LHS.

The total inductance of the inductive frequency-determining components in the oscillator 300 is equal to the inductance of inductor L1 in series with that of the inductor L2.

The transistors Q0, Q1 are connected at their bases to a bias voltage source VB via resistors R3 and R4 respectively so as to forward bias their base-emitter junctions.

The transistors Q0, Q1 are capacitively cross-coupled. Specifically, coupling capacitors C2 and C3 couple the signals generated at the collectors of transistors Q1 and Q0 to the bases of the transistors Q0, Q1 respectively to cause oscillation in a well-known manner. The varactor pairs C10, C13; C10, C14; and C12, C15 are selected such that the varactors of each pair have the same C/V characteristic. However, the C/V characteristic of each pair may be selected to have a different characteristic and in particular different capacitance ranges. In a preferred embodiment, the C/V characteristic of the complete set of varactors follows a square law curve in order to achieve a linearized frequency/voltage characteristic for the voltage controllable oscillator. This can be achieved, for example, by use of a varactor associated with the highest offset voltage which has a characteristic having a steeper C/V curve and extends over a larger capacitive range.

Variations may be made without departing from the scope of the invention. For example, the control means may comprise a plurality of control sources connected to the plurality of variable capacitance elements; or a common offset bias and a plurality of different value control sources connected to the capacitance elements. Furthermore, the circuit arrangement 100 may be used for a tunable filter or any other application requiring a linearized variable capacitance.

A presently preferred embodiment of the subject invention is shown in FIG. 2.

While at least one presently preferred embodiment of the invention has been described using specific terms, such description is for illustrative purposes only, and it is to be understood that changes and variations may be made without departing from the spirit or scope of the following claims.

What is claimed is:

1. A tunable radio frequency (RF) circuit comprising:
   a resonant combination of a tuning varactor, a modulation varactor and an associated inductance; and
   a tuning control input and modulation input coupled to the tuning varactor and the modulation varactor, the tuning control input and modulation input being DC isolated from each other, wherein the tuning control input and modulation input comprise a common control source and a plurality of different offset biases each associated with a respective one of the tuning varactor and modulation varactor wherein the offset biases are independently controllable.

2. A tunable RE circuit according to claim 1, wherein the tuning varactor is provided with a DC voltage offset.

3. A tunable radio frequency (RF) circuit comprising:
   a circuit arrangement having:
      a plurality of tuning varactors effectively connected in parallel to provide a variable tuning capacitance;
      at least one inductor; and
      control means, coupled to the tuning varactors, for electronically controlling the capacitances of the varactors, having a control range over which the varactors cause the capacitance of the circuit arrangement to vary,
      wherein the control means and the varactors are configured such that at least one of the varactors exhibits complete variation of its capacitance, in response to The control means over only a portion of the control range,
      wherein the control means comprise a common control source and a plurality of different offset biases each associated with a respective one of the variable capacitance elements whereby the offset biases are independently controllable; and
   a modulator having:
      a modulation varactor arranged in parallel with the tuning varactors but isolated therefrom by a DC blocking capacitor; and
      a modulation input coupled to the modulation varactor.

4. A tunable RF circuit arrangement according to claim 3, wherein the modulation varactor has a voltage offset applied to one of its electrodes.

5. A tunable RF circuit according to claim 3, wherein the control means comprises a common voltage source and a plurality of different respective offset voltage sources applied across each of the varactors.

6. A voltage controllable oscillator comprising:
   a circuit arrangement having:
      a plurality of varactors effectively coupled in parallel to provide a variable capacitance; and
      control means, coupled to the varactors, for electronically controlling the capacitances of the varactors, having a control range over which the varactors cause the capacitance of the circuit arrangement to vary,
      wherein the control means and the varactors are configured such that at least one of the varactors exhibits complete variation of its capacitance in response to the control means over only a portion of the control range,
      wherein the control means comprise a common control source and a plurality of different offset biases each associated with a respective one of the variable capacitance elements whereby the offset biases are independently controllable; and
   a modulator which having:
      a modulation varactor ranged in parallel with the tuning varactors but isolated therefrom by a DC blocking capacitor; and
      a modulation input coupled to the modulation varactor.

7. A voltage controllable oscillator according to claim 6, wherein the varactors are selected so as to achieve a variable capacitance having a generally square law characteristic with respect to voltage such tat a frequency/voltage characteristic of the oscillator is linearised.

* * * * *